US006391701B1

(12) United States Patent
Inoue

(10) Patent No.: US 6,391,701 B1
(45) Date of Patent: May 21, 2002

(54) SEMICONDUCTOR DEVICE AND PROCESS OF FABRICATION THEREOF

(75) Inventor: Tatsuro Inoue, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/566,074

(22) Filed: May 8, 2000

(30) Foreign Application Priority Data

May 18, 1999 (JP) .......................................... 11-137895

(51) Int. Cl.$^7$ .......................................... H01L 21/8238
(52) U.S. Cl. ...................................... 438/225; 438/263
(58) Field of Search ................................ 438/981, 225, 438/279, 200, 263, 264; 257/288

(56) References Cited

U.S. PATENT DOCUMENTS

| 5,502,009 | A | * | 3/1996 | Lin ............................... 437/239 |
| 5,716,863 | A | * | 2/1998 | Arai ............................... 437/41 |
| 5,926,729 | A | * | 7/1999 | Tsai et al. ....................... 438/591 |
| 6,140,185 | A | * | 10/2000 | Kimura ......................... 438/275 |
| 6,207,509 | B1 | * | 3/2001 | Inoue ............................ 438/275 |

FOREIGN PATENT DOCUMENTS

| JP | 55-96681 | 7/1980 |
| JP | 61-105870 | 5/1986 |
| JP | 3-184368 | 8/1991 |
| JP | 8-130250 | 5/1996 |
| JP | 10-16337 | 6/1998 |
| JP | 10-223774 | 8/1998 |

* cited by examiner

Primary Examiner—David Nelms
Assistant Examiner—David Vu
(74) Attorney, Agent, or Firm—Hutchins, Wheeler & Dittmar

(57) ABSTRACT

In a process of fabrication of a semiconductor device having its gate insulation films differ from each other in film thickness, each of a semiconductor substrate and a gate insulation film has its surface prevented from being contaminated. This enables a new gate insulation film to be normally formed on the surface of the semiconductor substrate. The process includes the steps of: forming a first gate insulation film in a device forming region on the surface of the semiconductor substrate; forming a protection film on the first gate insulation film, the film being made of an inorganic material; forming a first photosensitive etching-resistance film on the protection film; etching the film by using the first photosensitive etching-resistance film as a mask to have the first gate insulation film of a predetermined one of the device forming regions exposed; removing the thus exposed first gate insulation film by using the protection film as a mask; having the surface of the semiconductor substrate exposed; and, forming a second gate insulation film on the thus exposed surface of the semiconductor substrate in a condition in which the protection film is not removed.

10 Claims, 6 Drawing Sheets

US 6,391,701 B1

SEMICONDUCTOR DEVICE AND PROCESS OF FABRICATION THEREOF

BACKGROUND OF THE INVENTION

1. Field of the Invention

The present invention relates to a semiconductor device and the process of fabricating such a device, and more particularly to a semiconductor device having its gate oxide films differ from each other in film thickness and formed on a same semiconductor substrate, and a process of fabrication thereof.

2. Description of the Related Art

It is required to increase a degree of integration of system LSIs and like circuits in the art, wherein these circuits have a plurality of functions and are formed on a same semiconductor substrate. In a semiconductor device thus formed, a plurality of voltage levels are often used. In such a case, a plurality of gate insulation films varying in film thickness are formed on the same semiconductor substrate, wherein a thickness of each of the gate insulation films is dependent on each of the voltage levels used therein. One of conventional semiconductor devices of this type is disclosed in Japanese Laid-open Patent No. Hei 10-223774.

Now, with reference to sectional views shown in FIGS. 6A to 6E, a conventional process of fabricating such conventional semiconductor device will be described, wherein the conventional semiconductor device is provided with a plurality of gate insulation films which are different from each other in film thickness.

In this conventional process of fabricating the conventional semiconductor device, first, as shown in FIG. 6A, a field insulation film 2 is formed on a device isolation region (hereinafter may also be referred to as an ISO region) of an upper surface of a semiconductor substrate 1 by using a LOCOS (Local Oxidation of Silicon) process which is well known in the art. As a result, a plurality of device forming regions (ACTA and ACTB regions) are separated from each other and defined as individual device forming regions by such formation of the field insulation film 2.

Then, as shown in FIG. 6B, a plurality of gate insulation films 3 are formed on the surface of the semiconductor substrate 1 having been exposed in these device forming regions. Subsequent to the above, a resist film 4 is formed to cover all the field insulation film 2 and the gate insulation films 3.

After that, as shown in FIG. 6C, the resist film 4 is patterned by photolithography and etching: to form an opening portion 5 of the resist film 4 in a position corresponding to that of the device forming region (ACTB region) in which a second gate insulation film 6 thin in film thickness should be formed; and, to cover the other device forming region (ACTA region) in which a first gate insulation film 3a thick in film thickness is formed. Then, the gate insulation film 3 thus exposed through the opening portion 5 of the resist film 4 is removed by wet-etching with the use of the thus patterned resist film 4 as a mask.

Subsequent to the above, as shown in FIG. 6D, all the resist film 4 is removed. After that, the surface of the semiconductor substrate 1 is subjected to a thermal oxidation process in positions corresponding to those of the device forming regions ACTA and ACTB, and thereby: additionally forming the second gate insulation film 6 in the surface of the semiconductor substrate 1 in the positions corresponding to those of the ACTB regions; and, increasing the gate insulation film 3 in film thickness due to addition of a newly oxidized portion of the surface of the semiconductor substrate 1 thereto to form the first gate insulation film 3a thick in film thickness in the positions corresponding to those of the ACTA regions.

Now, as shown in FIG. 6E, a polysilicon film is formed and patterned over an entire surface of the semiconductor substrate 1, so that a plurality of the gate electrodes 7 is formed. Then, the first gate insulation film 3a and the second gate insulation film 6 are selectively removed by etching with the use of the gate electrodes 7 as masks, so that only those of the first gate insulation film 3a and the second gate insulation film 6 having been covered by the gate electrodes 7 remain unremoved to form a first gate insulation film 3b and a second gate insulation film 6a, respectively.

Subsequent to the above, drain/source region, S/D regions 8a, 8b, are formed in the exposed surface of the semiconductor substrate 1 in positions adjacent to opposite sides of each of the gate electrodes 7 by ion implantation of a conductive impurity into the surface of the semiconductor substrate 1 with the use of the gate electrode 7 as a mask.

The above ion implantation process is followed by well-known conventional process steps, so that the conventional semiconductor device having its first and its second gate insulation film 3b, 6a differ from each other in film thickness is completed in fabrication.

Now, a problem to be solved by the present invention will be described.

In the above-mentioned conventional process of fabricating the semiconductor device, however, there is a danger that a so-called "teardrop ("Mizutama" in Japanese language)" defect appears in each of the surface of the gate insulation film 3 and the surface of the semiconductor substrate 1, in which defect the additional first gate insulation film 3a and the second gate insulation film 6 additionally formed are not formed in the gate insulation film 3 and the surface of the semiconductor substrate 1, respectively, during the process step shown in FIG. 6D.

SUMMARY OF THE INVENTION

In view of the above, it is an object of the present invention to provide a semiconductor device and a process of fabricating such a device, wherein: the semiconductor device has its gate insulation films differ from each other in film thickness; and, the process of fabrication of the device is capable of preventing each of a surface of a semiconductor substrate of the device and a surface of each of the gate insulation films of the device from being contaminated, and therefore capable of normally forming a new gate insulation film on each of the surface of the previous gate insulation film and the surface of the semiconductor substrate.

According to a first aspect of the present invention, there is provided a process of fabricating a semiconductor device provided with a plurality of gate insulation films varying in film thickness, wherein the gate insulation films are formed on the same semiconductor substrate, the process of fabricating a semiconductor device including the steps of:

selectively forming a device isolation region on a surface of the semiconductor substrate to form a plurality of device forming regions which are separated from each other through the device isolation region;

forming the first gate insulation film in each of the device forming regions on a surface of a semiconductor substrate;

forming a protection film made of an inorganic material on the first gate insulation film, wherein the inorganic material is resistant to an etching action exerted on the first gate insulation film;

forming a first photosensitive etching-resistance film on the protection film, wherein the first photosensitive etching-resistance film is resistant to an etching action exerted on the protection film;

patterning the first photosensitive etching-resistance film to form an opening portion of the first photosensitive etching-resistance film in a predetermined one of the device forming regions;

etching the protection film through the opening portion of the first photosensitive etching-resistance film to have the first gate insulation film exposed in the predetermined one of the device forming regions;

removing the thus exposed first gate insulation film by using the protection film as a mask so that the surface of the semiconductor substrate is exposed; and forming the second gate insulation film on the thus exposed surface of the semiconductor substrate.

In the foregoing, a preferable mode is one wherein the second gate insulation film is formed in a condition in which a protection film is not removed.

Also, a preferable mode is one wherein the step of forming the second gate insulation film is followed by the steps of:

patterning the protection film thus remaining unremoved on the first gate insulation film to form a first gate electrode;

forming a second photosensitive etching-resistance film over the entire surface of the semiconductor substrate;

patterning the second photosensitive etching-resistance film to form an opening portion of the second photosensitive etching-resistance film on the second gate insulation film;

forming a conductive film over the entire surface of the semiconductor substrate to form a second gate electrode on the second gate insulation film defined by the opening portion of the second photosensitive etching-resistance film, wherein the second gate electrode is formed of the conductive film; and removing the conductive film together with the second photosensitive etching-resistance film by removing the second photosensitive etching-resistance film through a lift-off process in a condition in which the second gate electrode remains unremoved.

Further, a preferable mode is one wherein the step of forming the second gate insulation film is followed by the steps of:

forming a third photosensitive etching-resistance film over the entire surface of the semiconductor substrate;

patterning the third photosensitive etching-resistance film to form an opening portion of the third photosensitive etching-resistance film on the second gate insulation film;

forming a conductive film over the entire surface of the semiconductor substrate to form a second gate electrode on the second gate insulation film defined by the opening portion of the third photosensitive etching-resistance film, wherein the second gate electrode is formed of the conductive film;

removing the conductive film together with the third photosensitive etching-resistance film by removing the third photosensitive etching-resistance film through a lift-off process in a condition in which the second gate electrode remains unremoved;

forming a fourth photosensitive etching-resistance film over the entire surface of the semiconductor substrate;

patterning the fourth photosensitive etching-resistance film to form a first and a second pattern of the fourth photosensitive etching-resistance film, wherein the first pattern covers the device forming regions in which the second gate electrodes have been formed, and the second pattern is formed in the device forming regions in which the first gate electrodes should be formed on the protection film; and etching the protection film by using the second pattern of the fourth photosensitive etching-resistance film as a mask to form the first gate electrode in each of the device forming regions.

Also, a preferable mode is one wherein the step of forming the second gate insulation film is followed by the steps of:

removing the protection film;

forming a conductive film to cover both the first gate insulation film and the second gate insulation film; and patterning the conductive film to form a first gate electrode and a second gate insulation film on the first gate insulation film and the second gate insulation film, respectively.

Further, a preferable mode is one wherein the protection film is formed of a semiconductor film.

Still further, a preferable mode is one wherein each of the first, the second, the third and the fourth photosensitive etching-resistance film forms a resist film.

According to a second aspect of the present invention, there is provided a semiconductor device fabricated by a process of fabricating a semiconductor device provided with a plurality of gate insulation films varying in film thickness, wherein the gate insulation films are formed on the same semiconductor substrate, the process including the steps of:

selectively forming a device isolation region on a surface of the semiconductor substrate to form a plurality of device forming regions which are separated from each other through the device isolation region;

forming a first gate insulation film in each of the device forming regions on the surface of the semiconductor substrate;

forming a protection film made of an inorganic material on the first gate insulation film, wherein the inorganic material is resistant to an etching action exerted on the first gate insulation film;

forming a first photosensitive etching-resistance film on the protection film, wherein the first photosensitive etching-resistance film is resistant to an etching action exerted on the protection film;

patterning the first photosensitive etching-resistance film to form an opening portion of the first photosensitive etching-resistance film in a predetermined one of the device forming regions;

etching the protection film through the opening portion of the first photosensitive etching-resistance film to have the first gate insulation film exposed in the predetermined one of the device forming regions;

removing the thus exposed first gate insulation film by using the protection film as a mask so that the surface of the semiconductor substrate is exposed; and forming a second gate insulation film on the thus exposed surface of the semiconductor substrate.

Action of the present invention having an above configuration is as follows, namely:

First, with respect to a problem inherent in the conventional process of fabricating a semiconductor device shown in FIGS. 6A and 6B, the inventor of the present invention has found that the gist of the problem resides in the fact that a residue of the resist film used in a patterning process remains unremoved on a surface of a gate insulation film due to such resist film's immediate contact with the gate insulation film 3, wherein the residue is produced when: an opening portion is formed in the resist film; the gate insulation film is wet-etched; and, the resist film is removed.

In view of this finding, the present invention having the above process construction was made. Consequently, in the present invention, the first photosensitive etching-resistance film such as the resist film is not directly formed on the first gate insulation film which is formed first on the surface of the semiconductor substrate. More specifically, in the present invention, the protection film made of an inorganic material is interposed between the first gate insulation film and the resist film. Due to this construction, in the present invention, at a time after the first gate insulation film is formed and before the second gate insulation film is formed, there is no danger that the photosensitive etching-resistance film is brought into immediate contact with each of the surface of the first gate insulation film and the surface of the semiconductor substrate in which the second gate insulation film should be formed. Consequently, the process of the present invention is capable of preventing such surface of each of the first gate insulation film and the semiconductor substrate (in which the second gate insulation film should be formed) from being contaminated with the residue of the resist film (photosensitive etching-resistance film). This makes it possible for the process of the present invention to normally form the second gate insulation film on the surface of the semiconductor substrate.

Further, in the present invention having the above construction, a conductive film is used as such a protection film, which makes it possible to use the conductive film directly as a gate electrode after completion of patterning of the conductive film. Consequently, it is possible for the process of the present invention to have the first and the second gate insulation film not subjected to a dry etching process which is performed to remove the protection film. This makes it possible to prevent the first and the second gate insulation film from being reduced in film thickness and from being damaged in surface quality.

BRIEF DESCRIPTION OF THE DRAWINGS

The above and other objects, advantages and features of the present invention will be more apparent from a following description taken in conjunction with accompanying drawings in which.

DETAILED DESCRIPTION OF THE PREFERRED EMBODIMENTS

Figure 1A:
FIGS. 1A, 1B, 1C and 1D are a series of sectional views of a semiconductor substrate provided with field insulation films thereon, illustrating a first group of process steps for fabricating a semiconductor device of a first embodiment of the present invention.

The best modes for carrying out the present invention will be described in detail using embodiments of the present invention with reference to the accompanying drawings.

The present invention may, however, be embodied in various different forms and should not be construed as limited to the embodiments set forth herein; rather, these embodiments are provided so that this disclosure will be thorough and complete, and will fully convey the scope of the present invention to those skilled in the art.

In the accompanying drawings, thickness of films and regions are exaggerated for clarity. Like reference numerals refer to like parts throughout the drawings.

Incidentally, it will also be understood that when a film is referred to as being "on" another film or substrate, it can be directly on such another film or substrate, or intervening films may also be present therebetween.

First Embodiment

FIGS. 1A to 1D, 2A to 2D and 3A to 3B show a series of sectional views of a semiconductor device of the present invention, illustrating a series of process steps of the process of the first embodiment of the present invention for fabricating such the semiconductor device.

In the above process of the present invention, as shown in FIG. 1A, a field insulation film 12 formed of silicon oxide film is first formed by a LOCOS process in a device isolation region (ISO region) on an upper surface of a semiconductor substrate 11 made of silicon, wherein the LOCOS process is well known in the art. As a result, a plurality of device forming regions, ACTA and ACTB, are defined and spaced apart from each other by such the field insulation film 12.

Figure 1B:
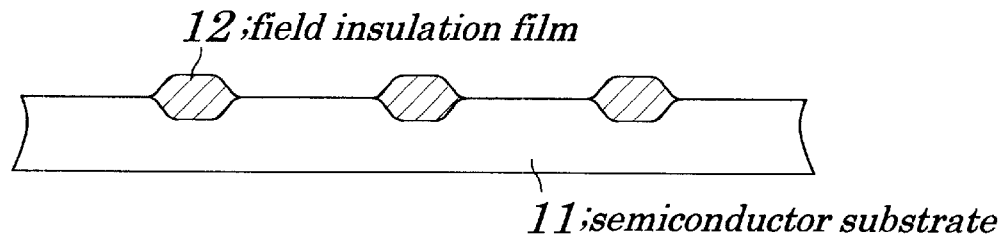

Then, as shown in FIG. 1B, a first gate insulation film 13 made formed of a silicon oxide film having a relatively thick film thickness of approximately 11 nm is formed by a thermal oxidation process performed on the surface of the semiconductor substrate 11, wherein a surface of the semiconductor substrate is exposed in the device forming regions ACTA and ACTB.

Figure 1C:
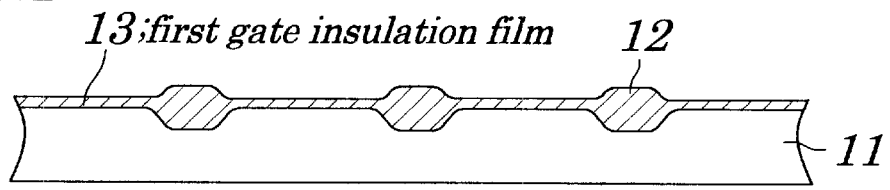

After that, as shown in FIG. 1C, a polysilicon film (protection film) 14 having a film thickness of approximately 150 nm is formed by a CVD process to cover the field insulation film 12 and the first gate insulation film 13. Subsequent to this, a resist film (first photosensitive etching-resistance film) 15 is formed on the polysilicon film (protection film) 14.

Figure 1D:
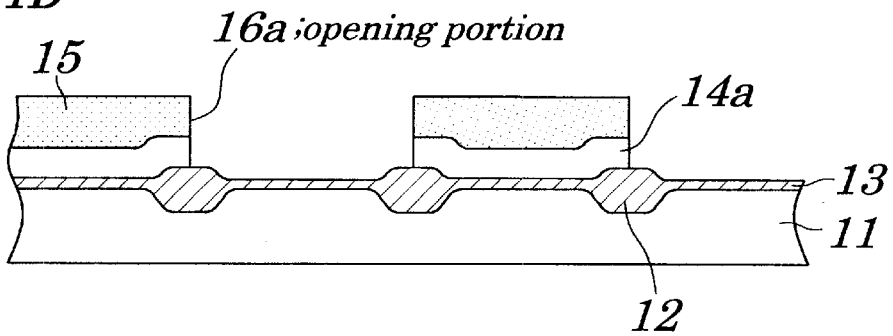

Then, as shown in FIG. 1D, an opening portion 16a of the resist film 15 is formed by photolithography in a position corresponding to the device forming region ACTB in which a second gate insulation film thin in film thickness should be formed later. At this time, the other device forming region ACTA in which the first gate insulation film thick in film thickness should be formed later is covered with the resist film 15. Subsequent to this, the polysilicon film 14 formed on the ACTB region is removed by dry etching performed through the opening portion 16a of the resist film 15, so that an opening portion 16b is formed in a condition in which a polysilicon film 14a formed on the ACTA region remains unremoved.

Figure 2A:
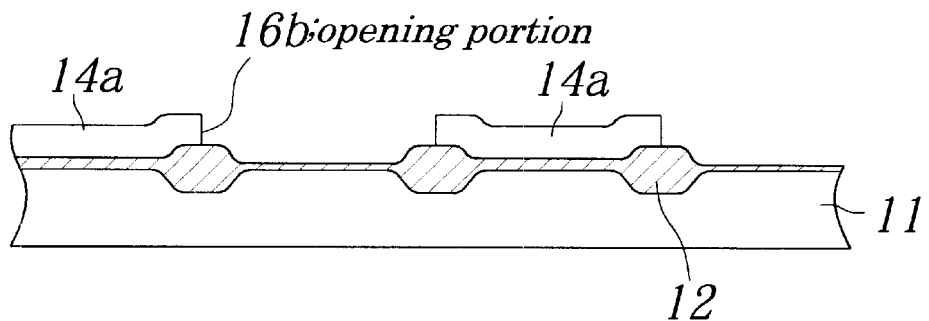
FIGS. 2A, 2B, 2C and 2D are a series of sectional views of the semiconductor substrate provided with the field insulation films thereon, illustrating a second group of process steps for fabricating the semiconductor device of the first embodiment of the present invention.

Then, after removal of the resist film 15, as shown in FIG. 2A, a wet-etching process is performed with the use of an etchant containing hydrofluoric acid to remove the first gate insulation film 13 which has been already exposed through removal of the polysilicon film 14 in the previous process step performed through the opening portion 16b of the polysilicon film 14a.

Figure 2B:
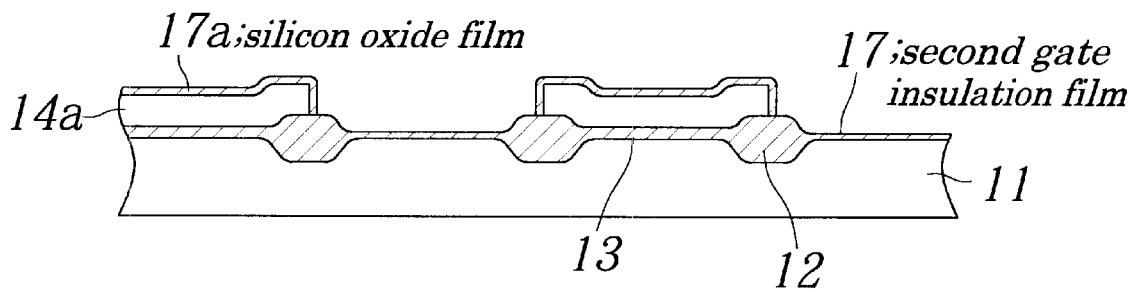

After that, as shown in FIG. 2B, the surface of the semiconductor substrate 11 is thermally oxidized in the ACTB region in a condition in which the polysilicon film 14a remains unremoved. As a result, a new second gate insulation film 17 formed of a silicon oxide film having a film thickness of approximately 10 nm is formed in the ACTB region on the surface of the semiconductor substrate 11. This gate insulation film 17 is so formed as to be thinner in film thickness than the gate insulation film 13 of the ACTA region. Incidentally, at this time, a silicon oxide film 17a is formed also on a surface of the polysilicon film 14a.

Figure 2C:
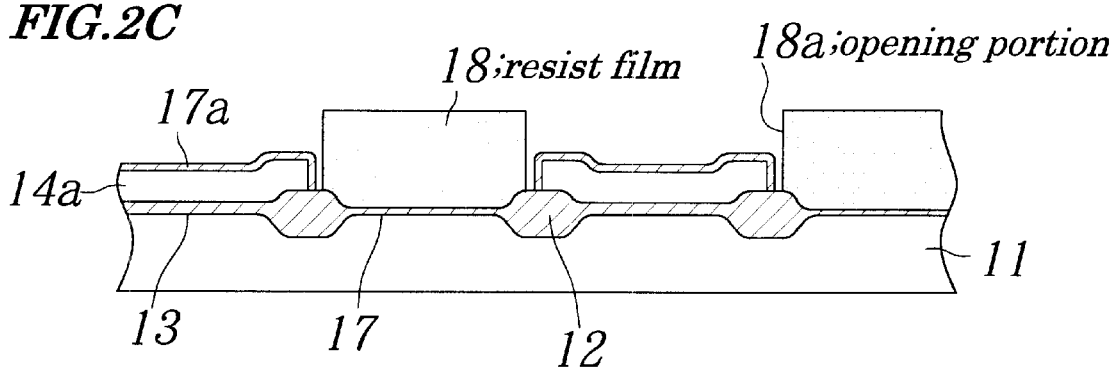

Then, as shown in FIG. 2C, a resist film 18 is formed over the entire surface of the semiconductor substrate 11. After that, the resist film 18 is patterned by photolithography, so that an opening portion 18a of the resist film 18 is formed in the ACTA region in a condition in which the resist film 18 remains unremoved in the ACTB region to permit the resist film 18 to still cover the ACTB region. Subsequent to this, the silicon oxide film 17a on the surface of the polysilicon film 14a and this polysilicon film 14 itself are sequentially etched off with the use of the resist film 18 serving as a mask.

Figure 2D:
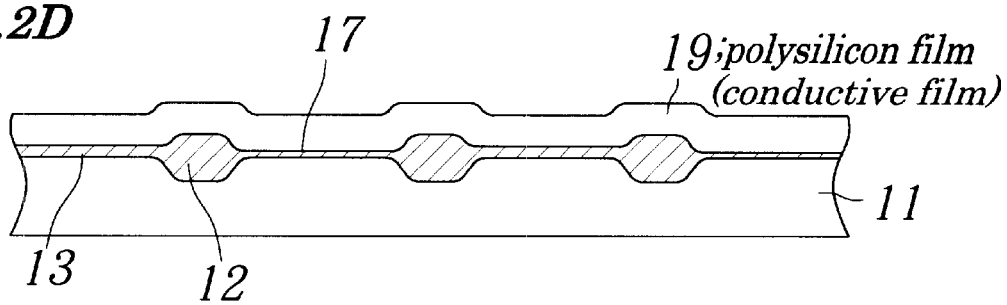
Figure 3A:
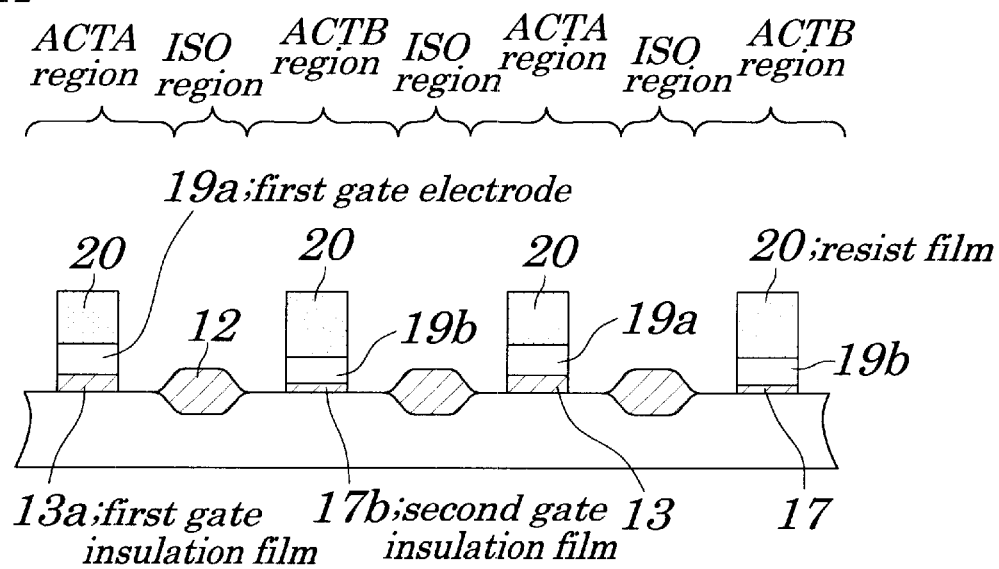
FIGS. 3A and 3B are a pair of sectional views of the semiconductor substrate provided with the field insulation films thereon, illustrating a third group of process steps for fabricating the semiconductor device of the first embodiment of the present invention.

Subsequent to the above, as shown in FIG. 2D, the resist film 18 is removed. After that, a polysilicon film (protection film) 19 having a film thickness of approximately 150 nm is formed by the CVD process to cover the first gate insulation film 13 of the ACTA region together with the second gate insulation film 17 of the ACTB region. Now, as shown in FIG. 3A, a resist film 20 is formed to cover the polysilicon film 19, and then patterned so that the resist film 20 remains unremoved in the ACTA and ACTB region, in which the first and the second gate electrode should be formed, respectively. Then, the surface of the semiconductor substrate 11 is exposed by sequentially removing the polysilicon film 19 and the gate insulation films 13, 17 through a dry etching process, wherein the dry etching process is performed with the use of the resist film 20 serving as a mask. As a result, a first gate electrode 19a and a second gate electrode 19b both formed of a polysilicon film are formed. At the same time, the first gate insulation film 13a and the second gate insulation film 17b are formed under the first gate electrode 19a and the second gate electrode 19b, respectively.

Figure 3B:
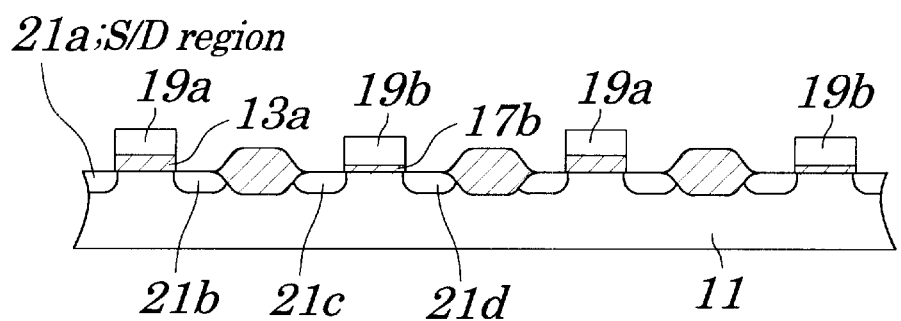

Then, in a condition in which the resist film 20 remains unremoved, or, after removal of such resist film 20, as shown in FIG. 3B, a conductive impurity which is opposite to the semiconductor substrate 11 in conductive type is ion-implanted in the surface of the semiconductor substrate 11 with the use of the first gate electrode 19a and the second gate electrode 19b both serving as masks in the above ion implantation process. Subsequent to this, a heating process is performed to activate the conductive impurity so that: source/drain regions (S/D regions) 21a, 21b are formed in the surface of the semiconductor substrate 11 in positions adjacent to opposite sides of the first gate electrode 19a; and, source/drain regions (S/D regions) 21c, 21d are formed in the surface of the semiconductor substrate 11 in positions adjacent to opposite sides of the second gate electrode 19b.

After that, a series of conventional process steps follow the above process step to complete a product, the semiconductor device of the present invention which has its first gate insulation film 13a and its second gate insulation film 17b differ from each other in film thickness.

As described above, in the first embodiment of the present invention, as shown in FIG. 1C, the resist film 15 is not formed directly on the first gate insulation film 13. In other words, since the polysilicon film 14 is interposed between the first gate insulation film 13 and the resist film 15, there is no danger that the surface of the first gate insulation film 13 and the surface of the semiconductor substrate 11 in which such a new second gate insulation film 17 should be formed are brought into immediate contact with the resist film 15 at a time after the first gate insulation film 13 is formed and before the new second gate insulation film 17 is still not formed. Due to this, in the present invention, there is no danger that the surface of the first gate insulation film 13 and the surface of the semiconductor substrate 11 are contaminated with the residue of the resist film 15.

Consequently, as shown in FIG. 2B, the process of the present invention is free from a teardrop defect inherent in the conventional process, and therefore capable of normally forming the second gate insulation film 17 on the surface of the semiconductor substrate 11.

Second Embodiment

FIGS. 4A to 4D show the second embodiment of a process for fabricating a semiconductor device of the present invention, illustrating a series of process steps for producing the semiconductor device of the present invention.

An essential difference in construction between the first and the second embodiment of the present invention is that the polysilicon film 14 serving as the protection film is used also as a gate electrode in the second embodiment in contrast with the first embodiment.

In the process of the second embodiment of the present invention, first, substantially same process steps as those of the process of the first embodiment of the present invention shown in FIGS. 1A to 1D and 2A to 2B are performed. After that, a first gate insulation film 13 and a second gate insulation film 17 are formed in an ACTA and ACTB region, respectively. At this time, a polysilicon film 14a serving as the protection film still remains unremoved on the first gate insulation film 13 in the ACTA region. Incidentally, a surface of the polysilicon film 14a is coated with a silicon oxide film 17a.

Figure 4A:
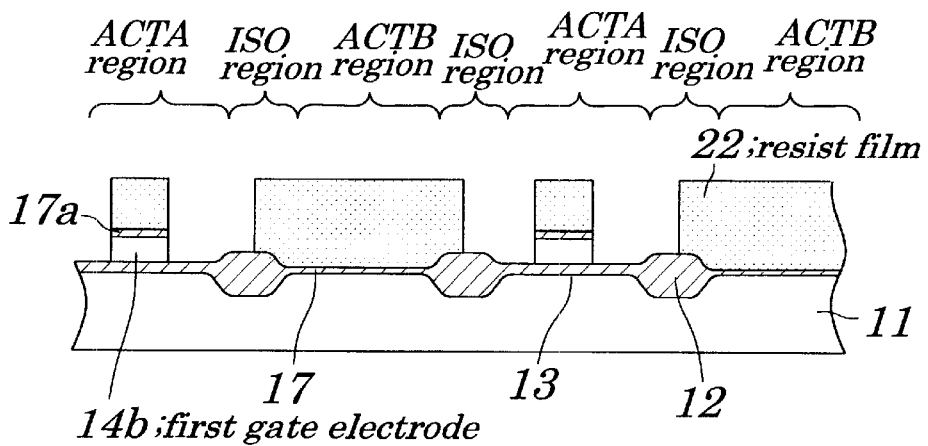
FIGS. 4A, 4B, 4C and 4D are a series of sectional views of a semiconductor substrate provided with field insulation films thereon, illustrating process steps for fabricating a semiconductor device of a second embodiment of the present invention.

After that, as shown in FIG. 4A, a resist film 22 is formed over an entire surface of a semiconductor substrate 11, and then patterned in a manner such that: the resist film 22 remains unremoved in the ACTA region in which a first gate electrode 14b should be formed; and, the ACTB region is covered with the resist film 22. Subsequent to this, the silicon oxide film 17a and the polysilicon film 14a both in the ACTB region are patterned with use of the resist film 22 as a mask to form the first gate electrode 14b.

Figure 4B:
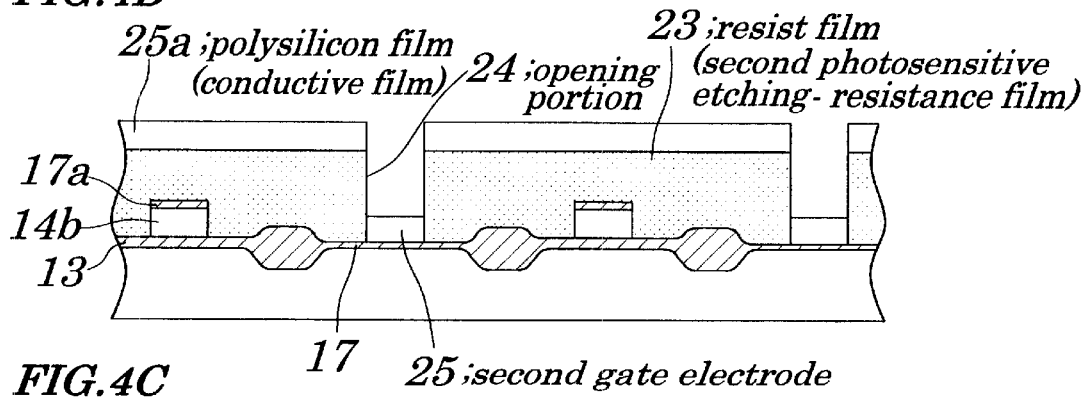

Then, the resist film 22 is removed. After that, as shown in FIG. 4B, a new resist film (second photosensitive etching-resistance film) 23 is formed over the entire surface of the semiconductor substrate 11. Subsequent to this, the thus formed resist film 23 is patterned to form an opening portion 24 of the resist film 23 in a position corresponding to that of the ACTB region in which a second gate electrode 25 should be formed. After that, a polysilicon film (protection film) 25, 25a having a film thickness of approximately 150 nm is formed over an entire surface of the semiconductor substrate 11 by a CVD process. As a result, the second gate electrode 25 formed of the polysilicon film is formed on the second gate insulation film 17 defined by the opening portion 24 of the resist film 23.

Figure 4C:
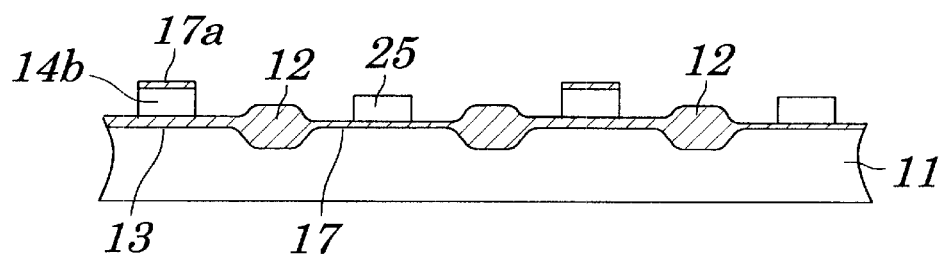

Then, as shown in FIG. 4C, the resist film 23 is removed together with the polysilicon film 25a by the lift-off process in a manner such that the second gate electrode 25 remains unremoved in the ACTB region, wherein the polysilicon film 25a is formed on the resist film 23.

Figure 4D:
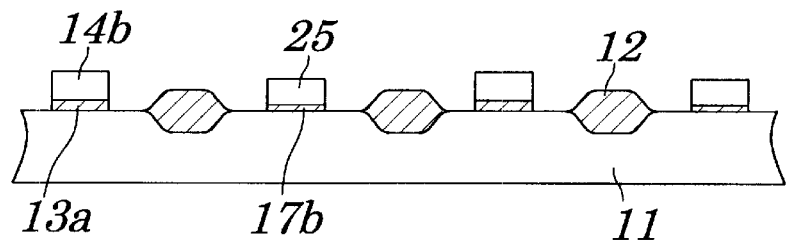

After that, as shown in FIG. 4D, a dry etching process is performed using the first gate electrode 14b and the second gate electrode 25 as masks, so that: the first gate insulation film 13 and the second gate insulation film 17 both exposed in the surface of the semiconductor substrate 11 are removed in positions adjacent to opposite sides of the first gate electrode 14b and to opposite sides of the second gate electrode 25, respectively. As a result, the first gate electrode 13a and the second gate electrode 17b are formed under the first gate insulation film 14b and the second gate insulation film 25, respectively.

Subsequent to the above process step, a series of conventional process steps are performed as is in a case of a process of the first embodiment of the present invention, so that the semiconductor device of the present invention having its first gate insulation film 13a and its second gate insulation film 17b differ from each other in film thickness is completed in production.

As described above, in the second embodiment of the present invention, the polysilicon film 14a serving as the protection film is patterned, and then directly used as the first gate electrode 14b. Consequently, there is no danger that the first gate insulation film 13a and the second gate insulation film 17b are subjected to an etchant such as a dry etching gas or like etchants used in the dry etching process for removing the polysilicon film 14a. This makes it possible to prevent the first gate insulation film 13a and the second gate insulation film 17b from decreasing in film thickness and also in surface quality.

Third Embodiment

FIGS. 5A to 5D show a series of sectional views of a semiconductor device of the present invention, illustrating a third embodiment of a process of fabricating the semiconductor device of the present invention.

In the third embodiment, a polysilicon film used as a protection film is patterned, and then used as a gate electrode as is in a case of the second embodiment of the process of the present invention. However, the third embodiment is different from the second embodiment in an order of formation of a first and second gate electrode. More specifically, this order is reversed in the third embodiment.

In the third, at first, process steps of the first embodiment shown in FIGS. 1A to 1B are performed. After that, a first gate insulation film 13 and a second gate insulation film 17 are formed in an ACTA and ACTB region, respectively. A polysilicon film 14a serving as a protection film and a silicon oxide film 17a remains unremoved on the first gate insulation film 13 of the ACTA region.

Figure 5A:
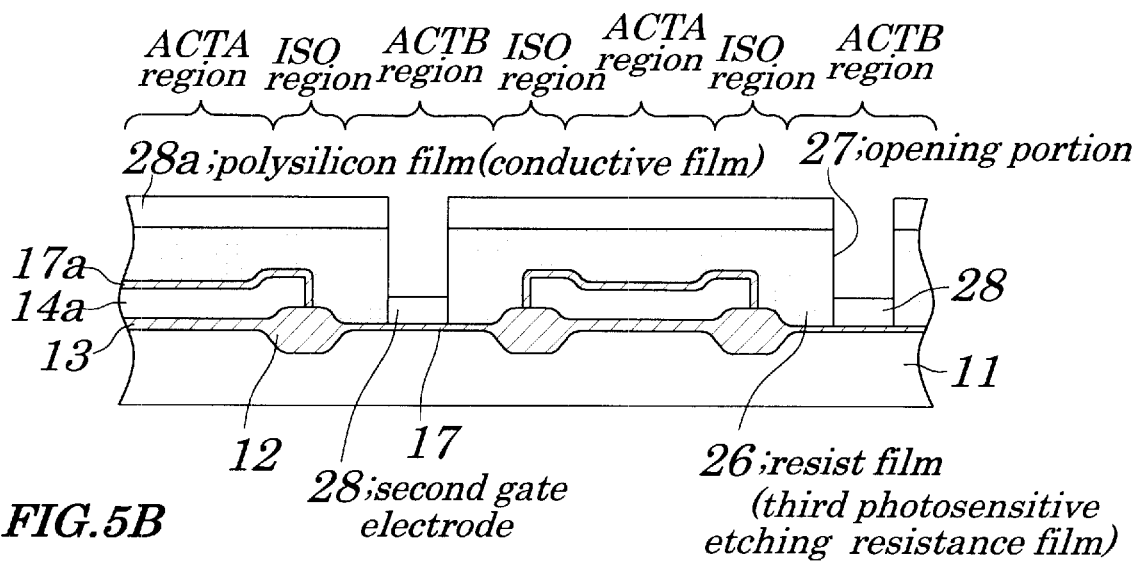
FIGS. 5A, 5B, 5C and 5D are a series of sectional views of a semiconductor substrate provided with field insulation films thereon, illustrating process steps for fabricating a semiconductor device of a third embodiment of the present invention.

After that, as show in FIG. 5A, a resist film (third photosensitive etching-resistance film) 26 is formed over an entire surface of a semiconductor substrate 11, and then patterned in a manner such that: an opening portion 27 of the resist film 26 is formed in the ACTB region in which a second gate electrode 28 should be formed; and, the ACTA region is covered with the resist film 26. Subsequent to this, a polysilicon film (protection film) 28, 28a having a film thickness of approximately 150 nm is formed over the entire surface of the semiconductor substrate 11 by a CVD process, so that the second gate electrode 28 formed of the polysilicon film is formed on the second gate insulation film 17 defined by the opening portion 27 of the resist film 26.

Figure 5B:
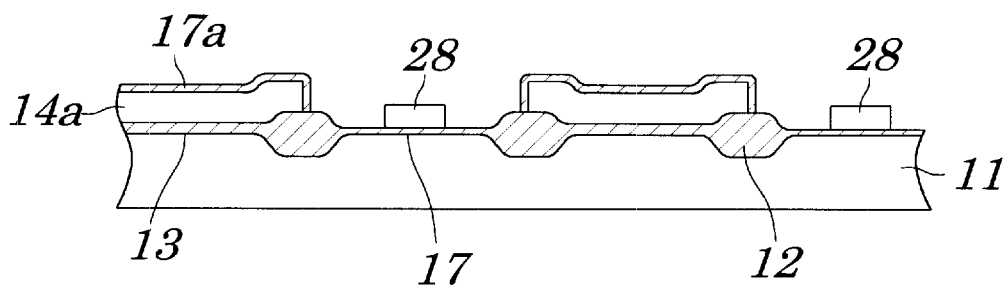

Then, as shown in FIG. 5B, the polysilicon film 28a is removed together with the resist film 26 by a lift-off process in a condition in which the second gate electrode 28 remains unremoved.

Figure 5C:
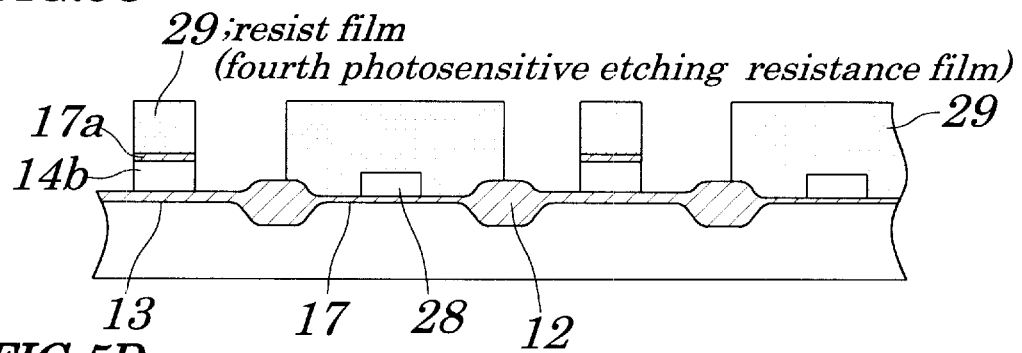

After that, a new resist film (fourth photosensitive etching-resistance film) 29 is formed over the entire surface of the semiconductor substrate 11. Subsequent to this, as shown in FIG. 5C, the resist film 29 is patterned so that: the resist film 29 remains unremoved on the silicon oxide film 17a, wherein the silicon oxide film 17a is formed on the ACTA region in which a first gate electrode 14b is formed; and, the ACTB region is covered with the resist film 29.

Then, the polysilicon film 14a formed on the ACTA region is patterned using the resist film 29 as a mask to form the first gate electrode 14b.

Figure 5D:
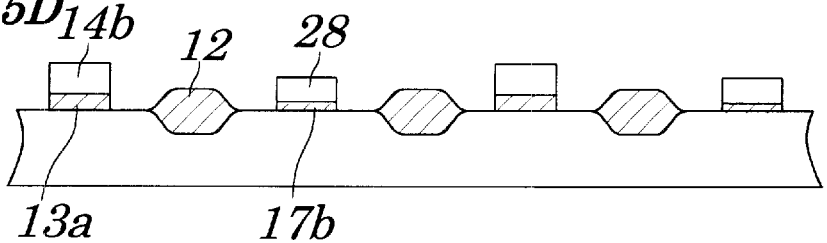
Figure 6A:
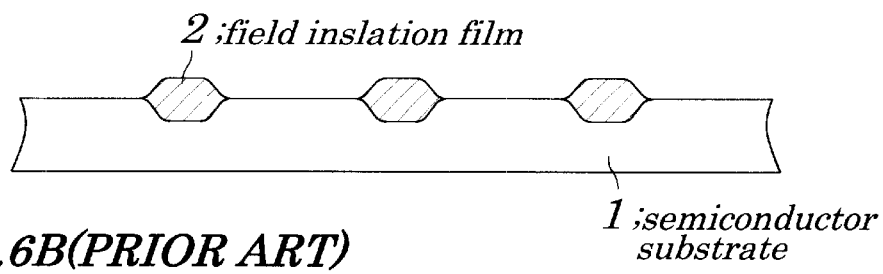
FIGS. 6A, 6B, 6C, 6D and 6E are a series of sectional views of a conventional semiconductor substrate provided with field insulation films thereon, illustrating conventional process steps for fabricating a conventional semiconductor device.
Figure 6B:
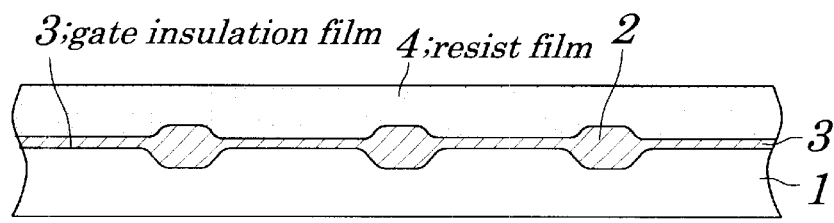
Figure 6C:
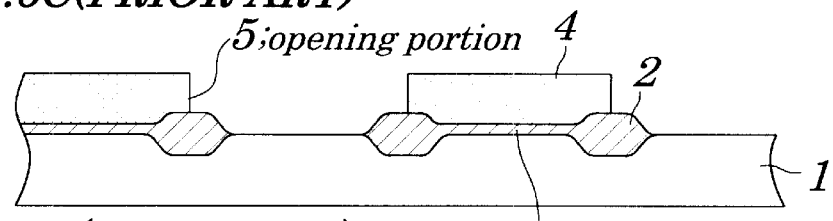
Figure 6D:
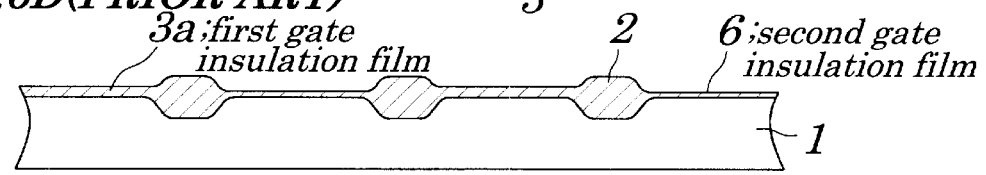
Figure 6E:
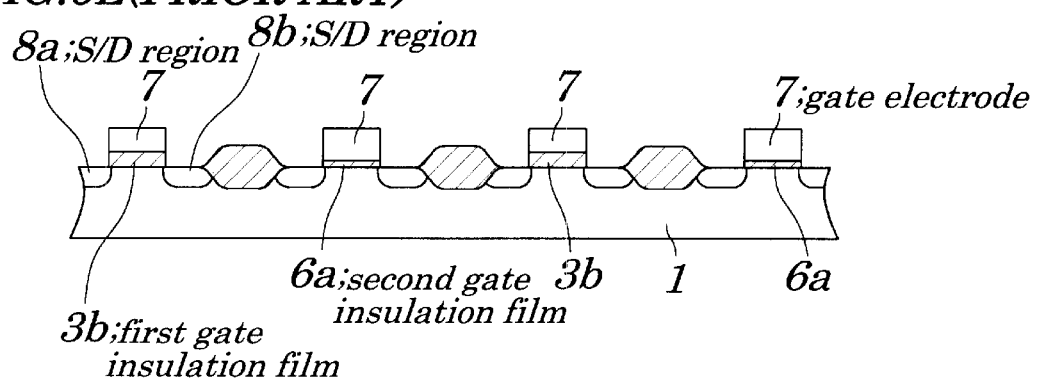

After that, as shown in FIG. 5D, the first gate insulation film 13 and the second gate insulation film 17 are removed by a dry etching process using the first gate electrode 14b and the second gate electrode 28 as masks, wherein: the first gate insulation film 13 to be removed is exposed on the surface of the semiconductor substrate 11 in positions adjacent to opposite sides of the first gate electrode 14; and, the second gate insulation film 17 is exposed on the surface of the semiconductor substrate 11 in positions adjacent to opposite sides of the second gate electrode 28. As a result of such dry etching process, a first gate insulation film 13a and a second gate insulation film 17b are formed under the first gate electrode 14b and the second gate electrode 28, respectively. After that, substantially same process steps as those performed in the first embodiment of the present invention are carried out, so that the semiconductor device having its gate insulation films 13a, 17b differ from each other in film thickness is completed.

As described above, in the third embodiment of the present invention, since the polysilicon film 14a serving as the protection film is so patterned as to be capable of directly serving as the first gate electrode 14b, it is possible for this third embodiment of the present invention to enjoy substantially a same effect as that obtained in the second embodiment of the present invention.

Although the embodiments of the present invention have been described in the above with reference to the drawings, the present invention is not limited to these embodiments in concrete construction. Any modification and change made without departing from the spirit of the present invention belong to the present invention.

For example, in the first embodiment of the present invention, as shown in FIG. 2A, after completion of removal of the resist film 15, the etching process is carried out to remove the first gate insulation film 13. However, it is also possible to carry out the etching process in a condition in which the resist film 15 remains unremoved.

Further, in the first embodiment of the present invention, as shown in FIG. 2B, the thermal oxidation process is carried out in a condition in which the polysilicon film 14*a* remains unremoved. However, it is also possible to carry out the thermal oxidation process after completion of removal of such polysilicon film 14*a*. Further, though the polysilicon film 14 is used as the protection film made of the inorganic material, the protection film may be formed of a nitride film, a refractory metal film or like films. When the refractory metal film is used as the protection film 14, it is also possible for the refractory metal film to be used as the gate electrode 14*b* as is in the case of the polysilicon film 14*a* in the above embodiment.

Further, though the ACTA regions in each of which the gate insulation film is thick in film thickness are spaced alternately with the ACTB regions in each of which the gate insulation film is thin in film thickness, the present invention is not limited to this arrangement. In other words, any other suitable arrangements may be used in the present invention. For example, in one of such suitable arrangements, a plurality of the device forming regions ACTA and ACTB may be formed into a group.

Now, an effect of the present invention will be described. As described above, in the present invention having the above construction, since the first photosensitive etching-resistance film 15 is not directly formed on the first gate insulation film 13 which is formed first, in other words, since the first protection film 14 made of the inorganic material is interposed between the first photosensitive etching-resistance film 15 and the first gate insulation film 13 as shown in FIG. 1C, there is no danger that each of the surface of the first gate insulation film 13 and the surface of the semiconductor substrate 11 on which the second gate insulation film 17 should be formed is brought into contact with the first photosensitive etching-protection film 15. This makes it possible to prevent the above surfaces from being contaminated with residue of the first photosensitive etching-resistance film 15. As a result, it is possible for the present invention to normally form the gate insulation films in the above surfaces in which the gate insulation film should be formed.

It is thus apparent that the present invention is not limited to the above embodiments but may be changed and modified without departing from the scope and spirit of the invention.

Finally, the present application claims the Convention Priority based on Japanese Patent Application No. Hei11-137895 filed on May 18, 1999, which is herein incorporated by reference.

What is claimed is:

1. In a process of fabricating a semiconductor device provided with a plurality of gate insulation films varying in film thickness, wherein the gate insulation films are formed on a same semiconductor substrate, the improvement therewith comprising the steps of:

selectively forming a device isolation region on a surface of said semiconductor substrate to form a plurality of device forming regions which are separated from each other through said device isolation region;

forming a first gate insulation film in each of said device forming regions on said surface of said semiconductor substrate;

forming a protection film made of an inorganic material on said first gate insulation film, wherein said inorganic material is resistant to an etching action exerted on said first gate insulation film;

forming a first photosensitive etching-resistance film on said protection film, wherein said first photosensitive etching-resistance film is resistant to an etching action exerted on said protection film;

patterning said first photosensitive etching-resistance film to form an opening portion of said first photosensitive etching-resistance film in at least one predetermined one of said plurality of device forming regions;

etching said protection film through said opening portion of said first photosensitive etching-resistance film to have said first gate insulation film exposed in said at least one predetermined one of said plurality of device forming regions;

removing the thus exposed first gate insulation film using said protection film as a mask so that the surface of said semiconductor substrate is exposed; and forming a second gate insulation film on the thus exposed surface of said semiconductor substrate.

2. The process of fabricating the semiconductor device, according to claim 1, wherein said step of forming said second gate insulation film is performed in a condition in which said protection film is not removed.

3. The process of fabricating the semiconductor device, according to claim 2, wherein the step of forming said second gate insulation film is followed by the steps of:

patterning said protection film thus remaining unremoved on said first gate insulation film to form a first gate electrode;

forming a second photosensitive etching-resistance film over substantially an entire portion of said surface of said semiconductor substrate;

patterning said second photosensitive etching-resistance film to form an opening portion of said second photosensitive etching-resistance film on said second gate insulation film;

forming a conductive film over the entire said surface of said semiconductor substrate to form at least a second gate electrode on said second gate insulation film defined by said opening portion of said second photosensitive etching-resistance film, wherein said at least a second gate electrode is formed of said conductive film; and removing said conductive film together with said second photosensitive etching-resistance film by removing said second photosensitive etching-resistance film through a lift-off process in a condition in which said at least a second gate electrode remains unremoved.

4. In a process of fabricating a semiconductor device provided with a plurality of gate insulation films varying in film thickness, wherein the gate insulation films are formed on a same semiconductor substrate, the improvement therewith comprising the steps of:

selectively forming a device isolation region on a surface of said semiconductor substrate to form a plurality of device forming regions which are separated from each other through said device isolation region;

forming a first gate insulation film in each of said device forming regions on said surface of said semiconductor substrate;

forming a protection film made of an inorganic material on said first gate insulation film, wherein said inorganic material is resistant to an etching action exerted on said first gate insulation film;

forming a first photosensitive etching-resistance film on said protection film, wherein said first photosensitive etching-resistance film is resistant to an etching action exerted on said protection film;

patterning said first photosensitive etching-resistance film to form an opening portion of said first photosensitive etching-resistance film in a predetermined one of said device forming regions;

etching said protection film through said opening portion of said first photosensitive etching-resistance film to have said first gate insulation film exposed in said predetermined one of said device forming regions;

removing the thus exposed first gate insulation film by using said protection film as a mask so that the surface of said semiconductor substrate is exposed; and forming a second gate insulation film on the thus exposed surface of said semiconductor substrate, wherein said second gate insulation film is formed in a condition in which said protection film is not removed; and wherein the step of forming said second gate insulation film is followed by the steps of:

forming a third photosensitive etching-resistance film over the said entire surface of said semiconductor substrate;

patterning said third photosensitive etching-resistance film to form an opening portion of said third photosensitive etching-resistance film on said second gate insulation film;

forming a conductive film over the entire said surface of said semiconductor substrate to form a second gate electrode on said second gate insulation film defined by said opening portion of said third photosensitive etching-resistance film, wherein said second gate electrode is formed of said conductive film;

removing said conductive film together with said third photosensitive etching-resistance film by removing said third photosensitive etching-resistance film through a lift-off process in a condition in which said second gate electrode remains unremoved;

forming a fourth photosensitive etching-resistance film over the entire said surface of said semiconductor substrate;

patterning said fourth photosensitive etching-resistance film to form a first and a second pattern of said fourth photosensitive etching-resistance film, wherein said first pattern covers said device forming regions in which said second gate electrodes have been formed, and said second pattern is formed in said device forming regions in which said first gate electrodes should be formed on said protection film; and etching said protection film by using said second pattern of said fourth photosensitive etching-resistance film as a mask to form said first gate electrode in each of said device forming regions.

5. In a process of fabricating a semiconductor device provided with a plurality of gate insulation films varying in film thickness, wherein the gate insulation films are formed on a same semiconductor substrate, the improvement therewith comprising the steps of:

selectively forming a device isolation region on a surface of said semiconductor substrate to form a plurality of device forming regions which are separated from each other through said device isolation region;

forming a first gate insulation film in each of said device forming regions on said surface of said semiconductor substrate;

forming a protection film made of an inorganic material on said first gate insulation film, wherein said inorganic material is resistant to an etching action exerted on said first gate insulation film;

forming a first photosensitive etching-resistance film on said protection film, wherein said first photosensitive etching-resistance film is resistant to an etching action exerted on said protection film;

patterning said first photosensitive etching-resistance film to form an opening portion of said first photosensitive etching-resistance film in a predetermined one of said device forming regions;

etching said protection film through said opening portion of said first photosensitive etching-resistance film to have said first gate insulation film exposed in said predetermined one of said device forming regions;

removing the thus exposed first gate insulation film by using said protection film as a mask so that the surface of said semiconductor substrate is exposed; and forming a second gate insulation film on the thus exposed surface of said semiconductor substrate, wherein the step of forming said second gate insulation film is followed by the steps of:

removing said protection film;

forming a conductive film to cover both said first gate insulation film and said second gate insulation film; and patterning said conductive film to form a first gate electrode and a second gate electrode film on said first gate insulation film and said second gate insulation film, respectively.

6. The process of fabricating the semiconductor device according to claim 5, wherein said protection film is formed of a semiconductor film.

7. The process of fabricating the semiconductor device according to claim 1, wherein said first photosensitive etching-resistance film forms a resist film.

8. The process of fabricating the semiconductor device according to claim 3, wherein said second photosensitive etching-resistance film forms a resist film.

9. The process of fabricating the semiconductor device according to claim 4, wherein each of said third and fourth photosensitive etching-resistance films forms a resist film.

10. A semiconductor device fabricated by a process of fabricating a plurality of gate insulation films varying in film thickness, wherein said gate insulation films are formed on a same semiconductor substrate, the process comprising the steps of:

selectively forming a device isolation region on a surface of said semiconductor substrate to form a plurality of device forming regions which are separated from each other through said device isolation region;

forming a first gate insulation film in each of said device forming regions on said surface of said semiconductor substrate;

forming a protection film made of an inorganic material on said first gate insulation film, wherein said inorganic material is resistant to an etching action exerted on said first gate insulation film;

forming a first photosensitive etching-resistance film on said protection film, wherein said first photosensitive etching-resistance film is resistant to an etching action exerted on said protection film;

patterning said first photosensitive etching-resistance film to form an opening portion of said first photosensitive etching-resistance film in at least one predetermined one of said plurality of device forming regions;

etching said protection film through said opening portion of said first photosensitive etching-resistance film to have said first gate insulation film exposed in said at least one predetermined one of said plurality of device forming regions;

removing the thus exposed first gate insulation film using said protection film as a mask so that the surface of said semiconductor substrate is exposed; and forming a second gate insulation film on the thus exposed surface of said semiconductor substrate.

\* \* \* \* \*